(12) United States Patent
Kim et al.

(10) Patent No.: US 11,573,606 B2
(45) Date of Patent: *Feb. 7, 2023

(54) FLEXIBLE DISPLAY DEVICE

(71) Applicant: SAMSUNG DISPLAY CO., LTD., Yongin-si (KR)

(72) Inventors: Hyun Kim, Seoul (KR); Minsoo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

This patent is subject to a terminal disclaimer.

(21) Appl. No.: 17/173,879

(22) Filed: Feb. 11, 2021

(65) Prior Publication Data

US 2021/0165460 A1 Jun. 3, 2021

Related U.S. Application Data

(63) Continuation of application No. 16/798,932, filed on Feb. 24, 2020, now Pat. No. 10,921,857.

(30) Foreign Application Priority Data

Mar. 27, 2019 (KR) ........................ 10-2019-0035281

(51) Int. Cl.
*G06F 1/16* (2006.01)
*G09F 9/30* (2006.01)
*H01L 51/00* (2006.01)

(52) U.S. Cl.
CPC .......... *G06F 1/1652* (2013.01); *G06F 1/1609* (2013.01); *G09F 9/301* (2013.01); *H01L 51/0097* (2013.01)

(58) Field of Classification Search
CPC combination set(s) only.
See application file for complete search history.

(56) References Cited

U.S. PATENT DOCUMENTS

| | | | |
|---|---|---|---|
| 9,219,245 B2 * | 12/2015 | Jung | .............. H01L 51/5243 |
| 9,276,055 B1 | 3/2016 | Son et al. | |
| 9,287,329 B1 | 3/2016 | Lee et al. | |
| 9,349,758 B2 | 5/2016 | Ki et al. | |
| 9,385,175 B2 | 7/2016 | Son et al. | |
| 9,425,418 B2 | 8/2016 | Kwon et al. | |
| 9,430,180 B2 | 8/2016 | Hirakata et al. | |
| 9,450,038 B2 | 9/2016 | Kwon et al. | |
| 9,490,312 B2 | 11/2016 | Lee et al. | |
| 9,515,099 B2 | 12/2016 | Kwon et al. | |
| 9,535,522 B2 | 1/2017 | Ahn | |
| 9,627,463 B2 | 4/2017 | Kwon et al. | |

(Continued)

FOREIGN PATENT DOCUMENTS

| | | |
|---|---|---|
| KR | 10-2017-0106621 | 9/2017 |
| KR | 10-2018-0021292 | 3/2018 |

(Continued)

*Primary Examiner* — Lisa Lea-Edmonds
(74) *Attorney, Agent, or Firm* — Lewis Roca Rothgerber Christie LLP (57) ABSTRACT

In a flexible display device including a non-bending area and a bending area, the flexible display device may include a circuit structure, a display structure on the circuit structure, and an organic layer under or over the circuit structure, the organic layer including a groove corresponding to the bending area.

19 Claims, 9 Drawing Sheets

(56) References Cited

U.S. PATENT DOCUMENTS

| | | |
|---|---|---|
| 9,673,423 B2 | 6/2017 | Lee et al. |
| 9,706,607 B2 | 7/2017 | Kim et al. |
| 9,748,322 B2 | 8/2017 | Ki et al. |
| 9,766,737 B2 | 9/2017 | Ahn |
| 9,768,415 B2 | 9/2017 | Son et al. |
| 9,780,157 B2 | 10/2017 | Kwon et al. |
| 9,812,659 B2 | 11/2017 | Kwon et al. |
| 9,941,337 B2 | 4/2018 | Kwon et al. |
| 9,980,326 B2 | 5/2018 | Kim et al. |
| 9,983,714 B2 | 5/2018 | Ahn |
| 10,020,464 B2 | 7/2018 | Son et al. |
| 10,038,013 B2 | 7/2018 | Kwon et al. |
| 10,038,154 B2 | 7/2018 | Lee et al. |
| 10,043,827 B2 | 8/2018 | Kwon et al. |
| 10,056,444 B2 | 8/2018 | Cho et al. |
| 10,103,179 B2 | 10/2018 | Kwon et al. |
| 10,103,354 B2 | 10/2018 | Son et al. |
| 10,115,928 B2 | 10/2018 | Son et al. |
| 10,120,421 B1 | 11/2018 | Hong et al. |
| 10,121,991 B2 | 11/2018 | Son et al. |
| 10,182,474 B2 | 1/2019 | Kim et al. |
| 10,224,502 B2 | 3/2019 | Cho et al. |
| 10,268,296 B2 | 4/2019 | Choi et al. |
| 10,304,869 B2 | 5/2019 | Kwon et al. |
| 10,305,066 B2 | 5/2019 | Son et al. |
| 10,361,254 B2 | 7/2019 | Park et al. |
| 10,361,393 B2 | 7/2019 | Kim et al. |
| 10,381,597 B2 | 8/2019 | Son et al. |
| 10,381,598 B2 | 8/2019 | Son et al. |
| 10,411,084 B2 | 9/2019 | Yeo |
| 10,411,205 B2 | 9/2019 | Kwon et al. |
| 10,418,572 B2 | 9/2019 | Kwon et al. |
| 10,582,612 B2 | 3/2020 | Kwon et al. |
| 10,599,184 B2 | 3/2020 | Kim et al. |
| 10,620,465 B2 | 4/2020 | Lee et al. |
| 10,665,823 B2 | 5/2020 | Kim et al. |
| 10,672,858 B2 | 6/2020 | Lee et al. |
| 10,748,971 B2 | 8/2020 | An et al. |
| 10,754,382 B2 | 8/2020 | Nam et al. |
| 10,761,664 B2 | 9/2020 | Kwon et al. |
| 10,770,517 B2 | 9/2020 | Bok |
| 10,784,453 B2 * | 9/2020 | Minami ................ G09G 3/3266 |
| 11,216,094 B2 * | 1/2022 | Ahn ...................... G06F 1/206 |
| 11,239,436 B2 * | 2/2022 | Minami ............... G09G 3/3266 |
| 2013/0126874 A1 * | 5/2013 | Jung ................... H01L 51/5243 438/34 |
| 2013/0169515 A1 | 7/2013 | Prushinskiy et al. |
| 2015/0029683 A1 | 1/2015 | Kim et al. |
| 2017/0020007 A1 | 1/2017 | Park et al. |
| 2018/0081219 A1 | 3/2018 | Kim |
| 2018/0286938 A1 | 10/2018 | Moon et al. |
| 2019/0140202 A1 | 5/2019 | Jin et al. |
| 2020/0273922 A1 | 8/2020 | Park et al. |
| 2021/0333611 A1 * | 10/2021 | Hirakata ............... G06F 1/1641 |
| 2022/0085327 A1 * | 3/2022 | Kim ................... H01L 51/5253 |
| 2022/0091718 A1 * | 3/2022 | Park ...................... G06F 3/0448 |
| 2022/0093720 A1 * | 3/2022 | Yi ......................... G06F 3/0412 |
| 2022/0097343 A1 * | 3/2022 | Kim ................... B32B 38/0012 |
| 2022/0121303 A1 * | 4/2022 | Ahn ...................... G06F 1/1656 |
| 2022/0123239 A1 * | 4/2022 | Minami ............... G09G 3/3266 |

FOREIGN PATENT DOCUMENTS

| | | |
|---|---|---|
| KR | 10-2018-0042485 | 4/2018 |
| KR | 10-2018-0130613 | 12/2018 |

* cited by examiner

FLEXIBLE DISPLAY DEVICE

CROSS-REFERENCE TO RELATED APPLICATIONS

This application is a continuation of U.S. patent application Ser. No. 16/798,932, filed on Feb. 24, 2020, which claims priority to and the benefit of Korean Patent Application No. 10-2019-0035281, filed on Mar. 27, 2019 in the Korean Intellectual Property Office (KIPO), the entire disclosure of each of which is incorporated by reference herein.

BACKGROUND

1. Field

Aspects of embodiments of the present disclosure relate to a display device.

2. Description of the Related Art

A conventional display device has been replaced by a thin portable display device. Recently, applications of a flexible display device that is bendable, rollable, or foldable when in use or during manufacture have been expanding.

SUMMARY

According to an aspect of embodiments of the present disclosure, a flexible display device having improved bending properties is provided.

According to an aspect of one or more embodiments, a flexible display device including a non-bending area and a bending area may include a circuit structure, a display structure on the circuit structure, and an organic layer under or over the circuit structure, the organic layer including a groove corresponding to the bending area.

In an embodiment, the flexible display device may further include a planarization layer between the circuit structure and the display structure. The display structure may include a first electrode on the planarization layer, a pixel defining layer at a periphery of the first electrode on the planarization layer, an emission layer on the first electrode, and a second electrode on the emission layer. The organic layer may include the planarization layer or the pixel defining layer.

In an embodiment, the flexible display device may further include an encapsulation structure on the display structure. A portion of the encapsulation structure may be inside the groove.

In an embodiment, the encapsulation structure may include a first inorganic encapsulation layer on the display structure, an organic encapsulation layer on the first inorganic encapsulation layer, and a second inorganic encapsulation layer on the organic encapsulation layer. A height of a first portion of the second inorganic encapsulation layer inside the groove may be lower than a height of a second portion of the second inorganic encapsulation layer outside the groove.

In an embodiment, the groove may be exposed.

In an embodiment, the flexible display device may further include a base structure under the circuit structure. The base structure may include a first base layer, a first barrier layer on the first base layer, a second base layer on the first barrier layer, and a second barrier layer between the second base layer and the circuit structure. The organic layer may include the second base layer.

In an embodiment, the flexible display device may further include an organic material in the groove.

In an embodiment, the non-bending area may include a first display area and a second display area located at a side of the first display area, and the bending area may be adjacent to a boundary between the first display area and the second display area.

In an embodiment, the non-bending area may include a display area and a non-display area located at a side of the display area, and the bending area may be adjacent to a boundary between the display area and the non-display area.

In an embodiment, the organic layer may include a plurality of grooves in the bending area.

According to an aspect of one or more embodiments, a flexible display device including a non-bending area and a bending area may include a base structure, a circuit structure on the base structure, a planarization layer on the circuit structure, a first electrode on the planarization layer, a pixel defining layer at a periphery of the first electrode on the planarization layer, an emission layer on the first electrode, and a second electrode on the emission layer. At least the pixel defining layer may include a groove corresponding to the bending area.

In an embodiment, the groove may be defined in the planarization layer and the pixel defining layer.

In an embodiment, the flexible display device may further include an encapsulation structure on the second electrode. A portion of the encapsulation structure may be inside the groove.

In an embodiment, the encapsulation structure may include a first inorganic encapsulation layer on the second electrode, an organic encapsulation layer on the first inorganic encapsulation layer, and a second inorganic encapsulation layer on the organic encapsulation layer. A height of a first portion of the second inorganic encapsulation layer inside the groove may be lower than a height of a second portion of the second inorganic encapsulation layer outside the groove.

In an embodiment, the groove may be exposed.

According to an aspect of one or more embodiments, a flexible display device including a non-bending area and a bending area may include a base structure including at least one base layer, a circuit structure on the base structure, a planarization layer on the circuit structure, and a display structure on the planarization layer. The at least one base layer of the base structure may include a groove corresponding to the bending area.

In an embodiment, the base structure may include a first base layer of the at least one base layer, a first barrier layer on the first base layer, a second base layer of the at least one base layer on the first barrier layer, and a second barrier layer between the second base layer and the circuit structure. The groove may be defined in the second base layer and the second barrier layer.

In an embodiment, the groove may be filled with an organic material.

In an embodiment, the base structure may include a first base layer of the at least one base layer, a first barrier layer on the first base layer, a second base layer of the at least one base layer on the first barrier layer, and a second barrier layer between the second base layer and the circuit structure. The groove may be defined in the first base layer, the first barrier layer, the second base layer, and the second barrier layer.

In an embodiment, the circuit structure may include a first inorganic insulation layer on the base structure and a second inorganic insulation layer on the first inorganic insulation layer. The first inorganic insulation layer and the second inorganic insulation layer may cover the groove, and an organic material may fill the groove on the second inorganic insulation layer.

In the flexible display device according to embodiments, the groove corresponding to the bending area may be formed. Therefore, stress applied to the bending area due to bending may be decreased, and a flexible display device in which the bending area may be bent with a relatively low curvature may be provided.

BRIEF DESCRIPTION OF THE DRAWINGS

Embodiments will be more clearly understood from the following detailed description of some illustrative, non-limiting embodiments taken in conjunction with the accompanying drawings.

DETAILED DESCRIPTION

Herein, flexible display devices in accordance with embodiments will be explained in further detail with reference to the accompanying drawings. Reference will be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It is to be understood that although terms such as "first" and "second" may be used herein to describe various components, these components are not limited by these terms, and the terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, area, or component is referred to as being "formed on" another layer, area, or component, it may be directly or indirectly formed on the other layer, area, or component. That is, for example, one or more intervening layers, areas, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
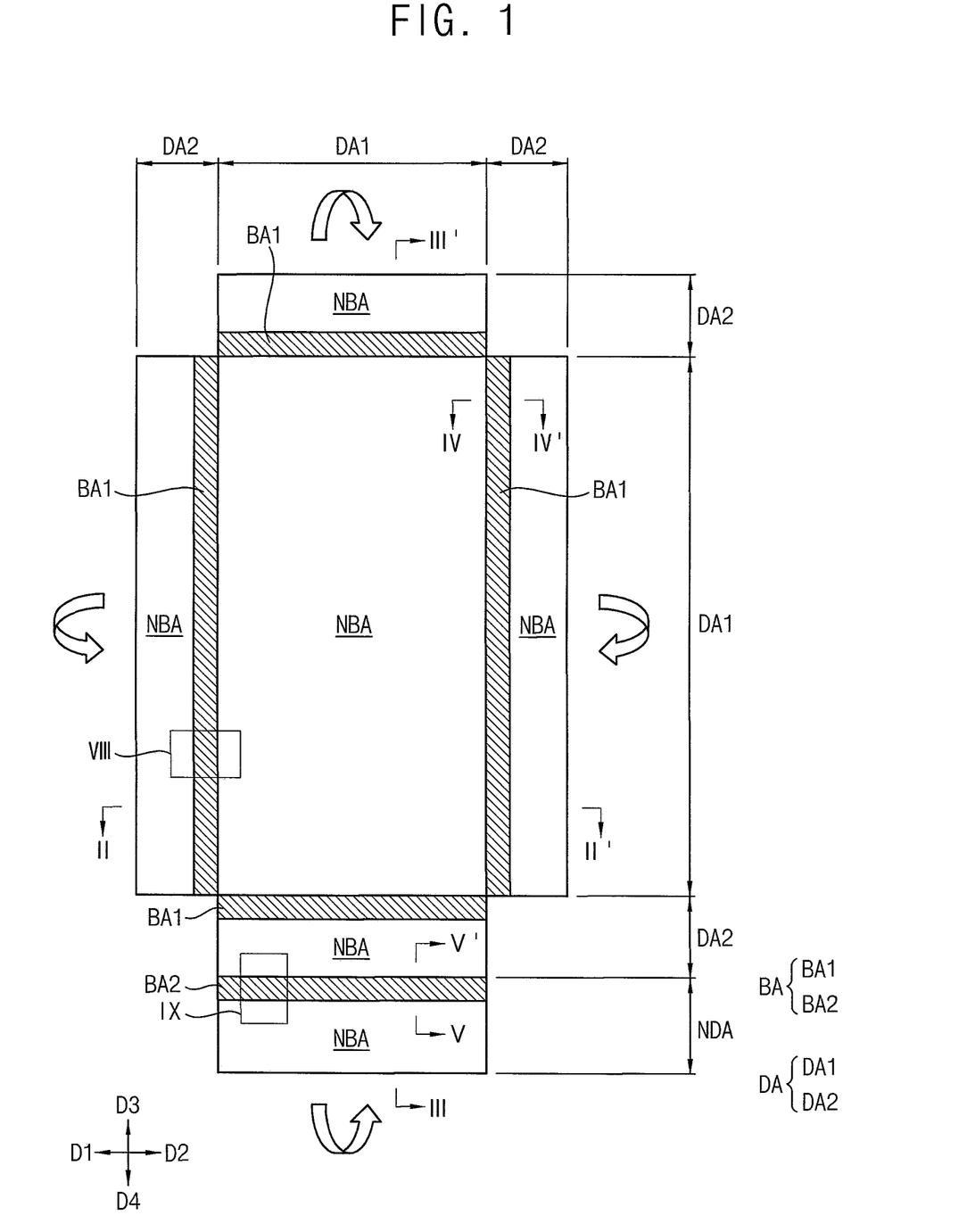
FIG. 1 is a plan view illustrating a flexible display device before bending, according to an embodiment.
Figure 2:
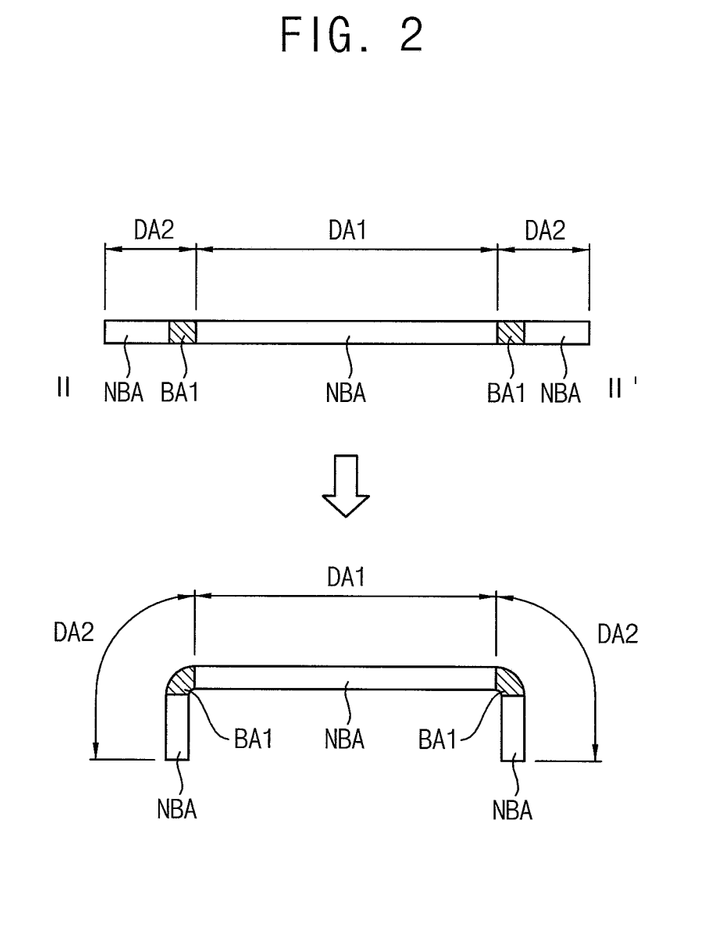
FIG. 2 is a cross-sectional view illustrating the flexible display device before and after bending, taken along the line II-II' in FIG. 1.

FIG. 1 is a plan view illustrating a flexible display device before bending according to an embodiment; FIG. 2 is a cross-sectional view illustrating the flexible display device before and after bending, taken along the line II-II' in FIG. 1; and FIG. 3 is a cross-sectional view illustrating the flexible display device before and after bending, taken along the line III-III' in FIG. 1.

Figure 3:
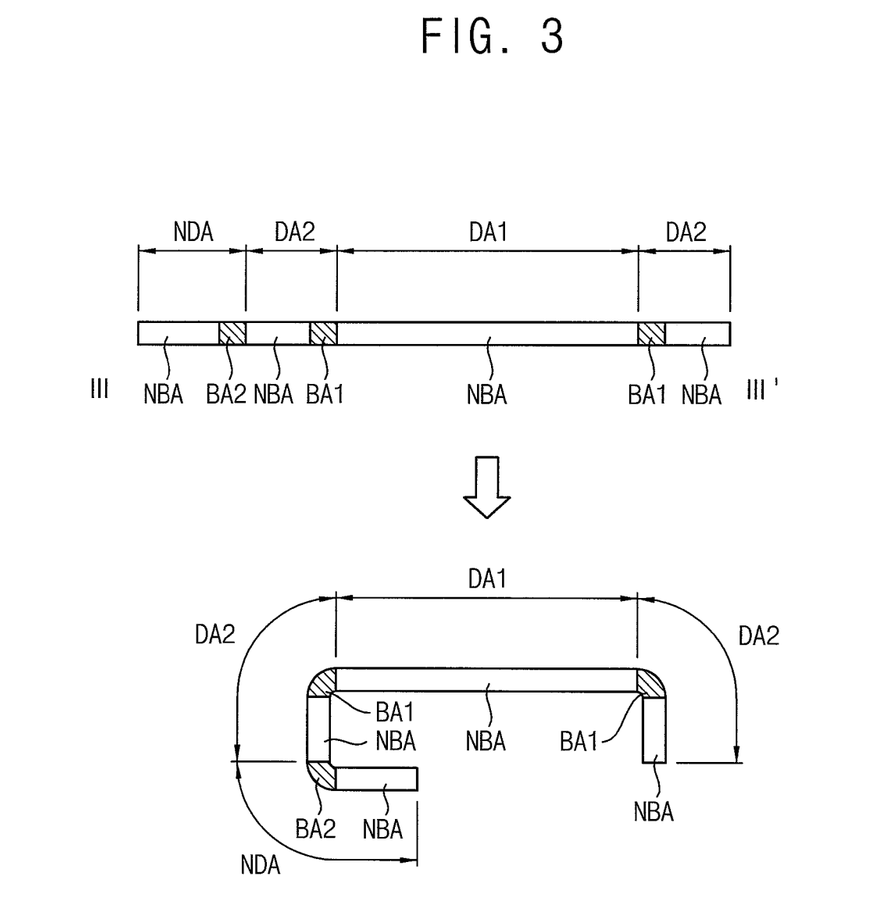
FIG. 3 is a cross-sectional view illustrating the flexible display device before and after bending, taken along the line III-III' in FIG. 1.

Referring to FIGS. 1, 2, and 3, a flexible display device according to an embodiment may include a non-bending area NBA and a bending area BA. The non-bending area NBA may be a flat area which is not bendable, and the bending area BA may be a bendable area that is bendable along a bending axis during a manufacturing process or during use. A flexibility of the bending area BA may be greater than a flexibility of the non-bending area NBA. In an embodiment, the flexible display device may include at least one non-bending area NBA and at least one bending area BA.

The flexible display device may include a display area DA and a non-display area NDA. Pixels may be disposed in the display area DA, and the display area DA may display an image through the pixels PX. Pads connected to external devices and wirings connecting the pads to the pixels may be disposed in the non-display area NDA, and signals for displaying an image may be provided to the pixels through the pads and the wirings.

The display area DA may include a first display area DA1 and a second display area DA2. The second display area DA2 may be located at at least one side of the first display area DA1. In an embodiment, the display area DA may include four second display areas DA2 respectively located at four sides of the first display area DA1. For example, two second display areas DA2 may be located in a first direction D1 and a second direction D2 opposite to the first direction D1, respectively, from the first display area DA1, and another two second display areas DA2 may be located in a third direction D3 crossing the first and second directions D1 and D2 and a fourth direction D4 opposite to the third direction D3, respectively, from the first display area DA1. In other words, four second display areas DA2 may be located at a left side, a right side, an upper side, and a lower side of the first display area DA1, respectively.

The non-display area NDA may be located at a side of the display area DA. In an embodiment, the non-display area NDA may be located at one side of the second display area DA2. The first display area DA1 and the non-display area NDA may be spaced apart from each other with the second display area DA2 disposed therebetween. For example, the non-display area NDA may be located in the fourth direction D4 from the second display area DA2 that is located in the fourth direction D4 from the first display area DA1.

In an embodiment, the non-bending area NBA may include the first display area DA1, the second display area DA2, and the non-display area NDA. In other words, a portion of the non-bending area NBA may be the first display area DA1 and the second display area DA2 thereby displaying an image, and another portion of the non-bending area NBA may be the non-display area NDA not displaying an image.

The bending area BA may include a first bending area BA1 and a second bending area BA2. The first bending area BA1 may be adjacent to a boundary between the first display area DA1 and the second display area DA2. For example, the first bending area BA1 may be located inside the second display area DA2, and may be adjacent to the boundary between the first display area DA1 and the second display area DA2. In an embodiment, the bending area BA may include four first bending areas BA1 respectively located at boundaries between the four sides of the first display area DA1 and the second display areas DA2. For example, two first bending areas BA1 may be respectively located at boundaries between the first display area DA1 and the second display areas DA2 located in the first direction D1 or the second direction D2 from the first display area DA1, and another two first bending areas BA1 may be respectively located at boundaries between the first display area DA1 and the second display areas DA2 located in the third direction D3 or the fourth direction D4 from the first display area DA1.

The first bending area BA1 may be bent along a bending axis in parallel with the first direction D1 or the third direction D3. For example, the first bending area BA1 located in the first direction D1 or the second direction D2 from the first display area DA1 may be bent along a bending axis in parallel with the third direction D3, and the first bending area BA1 located in the third direction D3 or the fourth direction D4 from the first display area DA1 may be bent along a bending axis in parallel with the first direction D1. Accordingly, the first display area DA1 may display an image to a front surface of the flexible display device, and the second display area DA2 may display an image to a side surface of the flexible display device.

The second bending area BA2 may be adjacent to a boundary between the display area DA and the non-display area NDA. In an embodiment, the second bending area BA2 may be adjacent to a boundary between the second display area DA2 and the non-display area NDA. For example, the second bending area BA2 may be located inside the non-display area NDA, and may be adjacent to the boundary between the second display area DA2 and the non-display area NDA. For example, the second bending area BA2 may be adjacent to a boundary between the second display area DA2 located in the fourth direction D4 from the first display area DA1 and the non-display area NDA.

The second bending area BA2 may be bent along a bending axis in parallel with the first direction D1 or the third direction D3. For example, the second bending area BA2 located in the fourth direction D4 from the second display area DA2 may be bent along a bending axis in parallel with the first direction D1. Accordingly, the non-bending area NBA of the non-display area NDA may face the first display area DA1.

Figure 4:
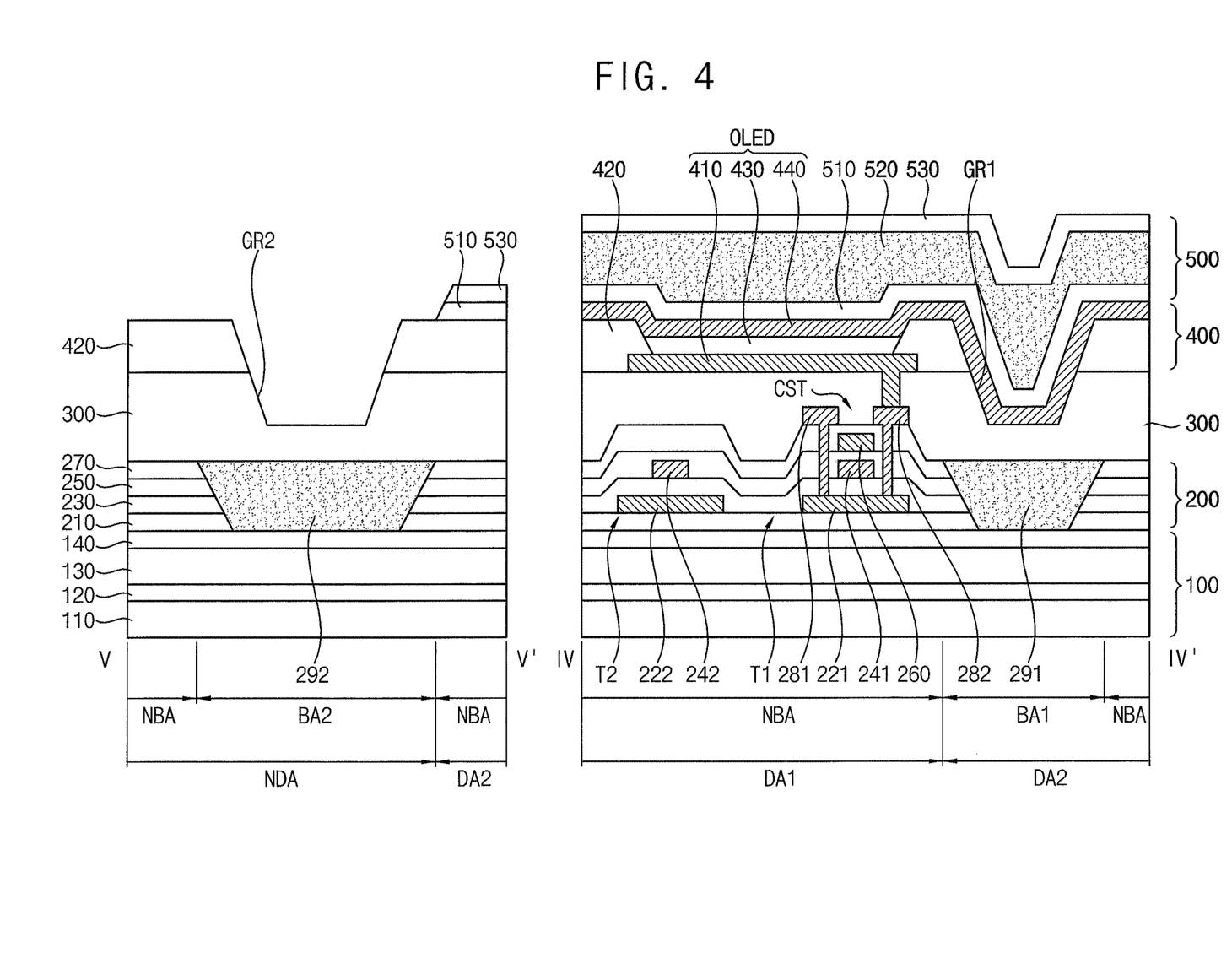
FIG. 4 is a cross-sectional view illustrating a flexible display device according to an embodiment.

FIG. 4 is a cross-sectional view illustrating a flexible display device according to an embodiment. FIG. 4 may illustrate an example of the flexible display device taken along a line IV-IV' and a line V-V' in FIG. 1.

Referring to FIGS. 1 and 4, a flexible display device according to an embodiment may include a base structure 100, a circuit structure 200, a planarization layer 300, a display structure 400, and an encapsulation structure 500. An organic layer 300 and 420 may be disposed over the circuit structure 200, and the organic layer 300 and 420 may have grooves GR1 and GR2 corresponding to the bending area BA.

The base structure 100 may provide a space or substrate to structures located on the base structure 100 thereby supporting elements of the flexible display device. The base structure 100 may include at least one base layer and at least one barrier layer. In an embodiment, the base structure 100 may include a first base layer 110, a first barrier layer 120, a second base layer 130, and a second barrier layer 140.

The first base layer 110 may include a material having flexibility and an electrical insulating property. For example, the first base layer 110 may be formed of an organic material, such as polyimide (PI), polyethylene naphthalate (PEN), polyethylene terephthalate (PET), polyarylate (PAR), polycarbonate (PC), polyetherimide (PEI), polyethersulfone (PS), or the like. However, a material of the first base layer 110 is not limited thereto, and any material having flexibility and an electrical insulating property may be used as the material of the first base layer 110.

The first barrier layer 120 may be disposed on the first base layer 110. The first barrier layer 120 may be formed of an inorganic material. For example, the first barrier layer 120 may include a material containing silicon, such as amorphous silicon (a-Si), silicon oxide ($SiO_x$), silicon nitride (SiNx), or the like. The first barrier layer 120 may be formed on the first base layer 110 that is vulnerable to oxygen and moisture to prevent or substantially prevent the first base layer 110 from being damaged, and may prevent or substantially prevent impurities such as oxygen and moisture from being permeated into the flexible display device.

The second base layer 130 may be disposed on the first barrier layer 120. The second base layer 130 may include a material having flexibility and electrical insulating property. In an embodiment, the second base layer 120 may include substantially the same material as that of the first base layer 110, or may have substantially the same thickness as that of the first base layer 110. However, embodiments are not limited thereto, and the first base layer 110 and the second base layer 130 may include a different material or have different thicknesses.

The second barrier layer 140 may be disposed on the second base layer 130. The second barrier layer 140 may be formed of an inorganic material. In an embodiment, the second barrier layer 140 may include substantially a same material as that of the first barrier layer 120, or may have substantially the same thickness as that of the first barrier layer 120. However, embodiments are not limited thereto, and the first barrier layer 120 and the second barrier layer 140 may include different material or have different thicknesses. The second barrier layer 140 may be formed on the second base layer 130 that is vulnerable to oxygen and moisture to prevent or substantially prevent the second base layer 130 from being damaged, and may prevent or substantially prevent impurities such as oxygen and moisture from being permeated into the flexible display device.

The circuit structure 200 may be disposed on the base structure 100. The circuit structure 200 may provide the display structure 400 electrical signals for driving the display structure 400. The circuit structure 200 may include at least one transistor and at least one capacitor. For example, the circuit structure 200 may include at least a driving transistor T1, a switching transistor T2, and a storage capacitor CST. In an embodiment, the circuit structure 200 may include a buffer layer 210, semiconductor layers 221 and 222, a first inorganic insulation layer 230, gate electrodes 241 and 242, a second inorganic insulation layer 250, a capacitor electrode 260, a third inorganic insulation layer 270, source/drain electrodes 281 and 282, and organic insulation layers 291 and 292.

The buffer layer 210 may be disposed on the base structure 100. The buffer layer 210 may prevent or substantially prevent impurities from being permeated through the base structure 100. Further, the buffer layer 210 may provide a planarized surface over the buffer layer 210. The buffer layer 210 may be formed of an inorganic material, such as silicon oxide ($SiO_x$), silicon nitride (SiNx), or the like. In another embodiment, the buffer layer 210 may be omitted.

The semiconductor layers 221 and 222 may be disposed on the buffer layer 210. The semiconductor layers 221 and 222 may include a first semiconductor layer 221 and a second semiconductor layer 222. The first semiconductor layer 221 and the second semiconductor layer 222 may be spaced apart from each other. The semiconductor layers 221 and 222 may be formed of amorphous silicon, polycrystalline silicon, or the like. In an embodiment, the semiconductor layers 221 and 222 may be formed of an oxide semiconductor. Each of the first semiconductor layer 221 and the second semiconductor layer 222 may include a source region, a drain region, and a channel region located between the source region and the drain region.

The first inorganic insulation layer 230 may be disposed on the semiconductor layers 221 and 222. The first inorganic insulation layer 230 may insulate the gate electrodes 241 and 242 from the semiconductor layers 221 and 222. The first inorganic insulation layer 230 may be formed of an inorganic material, such as silicon oxide ($SiO_x$), silicon nitride (SiNx), or the like.

The gate electrodes 241 and 242 may be disposed on the first inorganic insulation layer 230. The gate electrodes 241 and 242 may include a first gate electrode 241 and a second gate electrode 242. The first gate electrode 241 may overlap the first semiconductor layer 221, and the second gate electrode 242 may be spaced apart from the first gate electrode 241 and overlap the second semiconductor layer 222. The gate electrodes 241 and 242 may be formed of a metal, such as gold (Au), silver (Ag), copper (Cu), nickel (Ni), platinum (Pt), palladium (Pd), aluminum (Al), molybdenum (Mo), titanium (Ti), or the like. The second semiconductor layer 222 and the second gate electrode 242 that is insulated from the second semiconductor layer 222 by the first inorganic insulation layer 230 may form the switching transistor T2.

The second inorganic insulation layer 250 may be disposed on the gate electrodes 241 and 242. The second inorganic insulation layer 250 may insulate the capacitor electrode 260 from the first gate electrode 241. The second inorganic insulation layer 250 may be formed of an inorganic material, such as silicon oxide ($SiO_x$), silicon nitride (SiNx), or the like.

The capacitor electrode 260 may be disposed on the second inorganic insulation layer 250. The capacitor electrode 260 may overlap the first gate electrode 241. The capacitor electrode 260 may be formed of a metal, such as Au, Ag, Cu, Ni, Pt, Pd, Al, Mo, Ti, or the like. The first gate electrode 241 and the capacitor electrode 260 that is insulated from the first gate electrode 241 by the second inorganic insulation layer 250 may form the storage capacitor CST.

The third inorganic insulation layer 270 may be disposed on the capacitor electrode 260. The third inorganic insulation layer 270 may insulate the source/drain electrodes 281 and 282 from the capacitor electrode 260. The third inorganic insulation layer 270 may be formed of an inorganic material, such as silicon oxide ($SiO_x$), silicon nitride (SiNx), or the like.

The source/drain electrodes 281 and 282 may be disposed on the third inorganic insulation layer 270. The source/drain electrodes 281 and 282 may include a source electrode 281 and a drain electrode 282. The source electrode 281 and the drain electrode 282 may be respectively connected to the source region and the drain region of the first semiconductor layer 221. The source/drain electrodes 281 and 282 may be formed of a metal, such as gold (Au), silver (Ag), copper (Cu), nickel (Ni), platinum (Pt), palladium (Pd), aluminum (Al), molybdenum (Mo), titanium (Ti), or the like. The first semiconductor layer 221, the first gate electrode 241 that is insulated from the first semiconductor layer 221 by the first inorganic insulation layer 230, and the source electrode 281 and the drain electrode 282 connected to the first semiconductor layer 221 may form the driving transistor T1.

In an embodiment, portions of the inorganic insulation layers 210, 230, 250, and 270 inside the bending area BA of the circuit structure 200 may be removed, and the organic insulation layers 291 and 292 may be formed on the removed portions of the inorganic insulation layers 210, 230, 250, and 270. In an embodiment, a first organic insulation layer 291 may be formed on a removed portion of the inorganic insulation layers 210, 230, 250, and 270 inside the first bending area BA1 of the circuit structure 200, and a second organic insulation layer 292 may be formed on a removed portion of the inorganic insulation layers 210, 230, 250, and 270 inside the second bending area BA2 of the circuit structure 200. The first organic insulation layer 291 and the second organic insulation layer 292 may be formed of an organic material, such as a polyimide-based resin, a polyacrylate-based resin, or the like. A flexibility of the bending area BA of the circuit structure 200 including the organic insulation layers 291 and 292 may be greater than a flexibility of the non-bending area NBA of the circuit structure 200 including the inorganic insulation layers 210, 230, 250, and 270.

The planarization layer 300 may be disposed on the circuit structure 200. The planarization layer 300 may cover the circuit structure 200 to protect the circuit structure 200, and may provide a planarized surface to the display structure 400 located on the planarization layer 300. The planarization layer 300 may be formed of an organic material, such as a polyimide-based resin, a polyacrylate-based resin, or the like.

The display structure 400 may be disposed on the planarization layer 300. The display structure 400 may display an image based on electrical signals provided from the circuit structure 200. The display structure 400 may include a first electrode 410, a pixel defining layer 420, an emission layer 430, and a second electrode 440.

The first electrode 410 may be disposed on the planarization layer 300. The first electrode 410 may be connected to the source electrode 281 or the drain electrode 282 of the driving transistor T1. The first electrode 410 may be a transparent electrode or a reflective electrode. In an embodiment, the first electrode 410 may include ITO, IZO, ZnO, or $In_2O_3$ when being the transparent electrode, and may include a reflective layer formed of any of Ag, Mg, Al, Pt, Pd, Au, Ni, Nd, Ir, Cr, and a mixture thereof and a transparent layer formed of ITO, IZO, ZnO, or $In_2O_3$ when being the reflective electrode. In an embodiment, the first electrode 410 may have an ITO-Ag-ITO structure.

The pixel defining layer 420 may be disposed at a periphery of the first electrode 410 on the planarization layer 300. In an embodiment, the pixel defining layer 420 may cover an edge of the first electrode 410, and may include an opening that exposes a center portion of the first electrode 410. The pixel defining layer 420 may be located at a periphery of the first electrode 410 to define an emission area, and may space the second electrode 440 from the first electrode 410 to prevent or substantially prevent an arc or the like from occurring between the first electrode 410 and the second electrode 440. The pixel defining layer 420 may be formed of an organic material, such as a polyimide-based resin, a polyacrylate-based resin, or the like.

The emission layer 430 may be disposed on the first electrode 410. In an embodiment, the emission layer 430 may be disposed on a center portion of the first electrode 410 inside the opening of the pixel defining layer 420. Holes and electrons respectively provided from the first electrode 410 and the second electrode 440 may be combined at the emission layer 430 to form excitons, and light may be generated from the emission layer 430 when the excitons are changed from an excited state to a ground state. In an embodiment, a hole injection layer (HIL) and/or a hole transport layer (HTL) may be disposed between the first electrode 410 and the emission layer 430, and an electron transport layer (ETL) and/or an electron injection layer (EIL) may be disposed on the emission layer 430.

The second electrode 440 may be disposed on the emission layer 430. The second electrode 440 may be a transparent electrode or a reflective electrode. In an embodiment, the second electrode 440 may include ITO, IZO, ZnO, or $In_2O_3$ when being the transparent electrode, and may include a reflective layer formed of any of Ag, Mg, Al, Pt, Pd, Au, Ni, Nd, Ir, Cr, and a mixture thereof and a transparent layer formed of ITO, IZO, ZnO, or $In_2O_3$ when being the reflective electrode. The first electrode 410, the emission layer 430, and the second electrode 440 may form an organic light emitting diode OLED.

The encapsulation structure 500 may be disposed on the display structure 400. The encapsulation structure 500 may cover the display structure 400 to protect the display structure 400. In an embodiment, the encapsulation structure 500 may be formed in the display area DA, and may not be formed in the non-display area NDA. The encapsulation structure 500 may include at least one inorganic encapsulation layer and at least one organic encapsulation layer. In an embodiment, the encapsulation structure 500 may include a first inorganic encapsulation layer 510, an organic encapsulation layer 520, and a second inorganic encapsulation layer 530.

The first inorganic encapsulation layer 510 may cover the second electrode 440. The first inorganic encapsulation layer 510 may be formed along a profile of a structure disposed thereunder. In an embodiment, the first inorganic encapsulation layer 510 may be formed of silicon oxynitride ($SiO_xN_y$). However, embodiments are not limited thereto, and, in another embodiment, the first inorganic encapsulation layer 510 may be formed of silicon oxide, silicon nitride, aluminum oxide, titanium oxide, nickel oxide, or the like.

The organic encapsulation layer 520 may be disposed on the first inorganic encapsulation layer 510. The organic encapsulation layer 520 may have a relatively large thickness, and an upper surface of the organic encapsulation layer 520 may be substantially planarized inside the display area DA. The organic encapsulation layer 520 may be formed of polyethylene terephthalate, polyethylene naphthalate, polycarbonate, polyimide, polyethylene sulfonate, polyoxymethylene, polyarylate, hexamehyldisiloxane, or the like.

The second inorganic encapsulation layer 530 may be disposed on the organic encapsulation layer 520 and covering the organic encapsulation layer 520. The second inorganic encapsulation layer 530 may be formed along a profile of the upper surface of the organic encapsulation layer 520. In an embodiment, the second inorganic encapsulation layer 530 may be formed of silicon nitride (SiNx). However, embodiments are not limited thereto, and, in another embodiment, the second inorganic encapsulation layer 530 may be formed of silicon oxide, silicon oxynitride, aluminum oxide, titanium oxide, nickel oxide, or the like. In an embodiment, each of the first inorganic encapsulation layer 510 and the second inorganic encapsulation layer 530 may have an area greater than that of the organic encapsulation layer 520, and the first inorganic encapsulation layer 510 and the second inorganic encapsulation layer 530 may be in contact with each other outside the organic encapsulation layer 520. In other words, the organic encapsulation layer 520 may not be exposed by the first inorganic encapsulation layer 510 and the second inorganic encapsulation layer 530.

In an embodiment, the grooves GR1 and GR2 corresponding to the bending area BA may be formed in the planarization layer 300 and the pixel defining layer 420. In an embodiment, the grooves GR1 and GR2 may pass through an entirety of a thickness of the pixel defining layer 420 and at least a portion of a thickness of the planarization layer 300 inside the bending area BA. A first groove GR1 may be formed in the first bending area BA1, and a second groove GR2 may be formed in the second bending area BA2. The first groove GR1 may not overlap the first electrode 410.

In an embodiment, the grooves GR1 and GR2 passing through the pixel defining layer 420 and at least a portion of the planarization layer 300 may be formed by photolithography, laser drilling, or the like, in the bending area BA of the flexible display device in which the pixel defining layer 420 is formed, and the second electrode 440 and the encapsulation structure 500 may be formed in the display area DA on the pixel defining layer 420.

In an embodiment, a portion of the second electrode 440 and a portion of the encapsulation structure 500 which are disposed on the pixel defining layer 420 may be located inside the first groove GR1. As illustrated in FIG. 4, the second electrode 440 and the encapsulation structure 500 may sequentially cover the first groove GR1. Accordingly, for example, a portion of the second electrode 440, a portion of the first inorganic encapsulation layer 510, and a portion of the organic encapsulation layer 520 may be located inside the first groove GR1. However, embodiments are not limited thereto, and, in an embodiment, a portion of the second inorganic encapsulation layer 530 may be additionally located inside the first groove GR1.

In an embodiment, a height of a portion of the second inorganic encapsulation layer 530 inside the first groove GR1 may be lower than a height of another portion of the second inorganic encapsulation layer 530 outside the first groove GR1. For example, a height of a lower surface of the second inorganic encapsulation layer 530 inside the first groove GR1 from the base structure 100 may be lower than a height of a lower surface of the second inorganic encapsulation layer 530 outside the first groove GR1 from the base structure 100. The first inorganic encapsulation layer 510 may be formed along a profile of a structure disposed thereunder; therefore, the first inorganic encapsulation layer 510 may be formed along a profile of the first groove GR1 inside the first bending area BA1. The organic encapsulation layer 520 may provide a substantially planarized upper surface; however, in an embodiment, a height of an upper surface of the organic encapsulation layer 520 inside the first groove GR1 may be lower than a height of an upper surface of the organic encapsulation layer 520 outside the first groove GR1 due to the first groove GR1. Accordingly, a height of a portion of the second inorganic encapsulation layer 530 inside the first groove GR1 which is formed along the upper surface of the organic encapsulation layer 520 may be lower than a height of another portion of the second inorganic encapsulation layer 530 outside the first groove GR1.

When a bending area of a flexible display device according to a comparative example of the prior art in which a groove is not formed is bent, cracks may be formed in a second inorganic encapsulation layer away from a stress neutral plane, or the second inorganic encapsulation layer may be detached from an organic encapsulation layer. However, when the first bending area BA1 of the flexible display device according to embodiments of the present disclosure in which the first groove GR1 is formed is bent, the second inorganic encapsulation layer 530 inside the first bending area BA1 may be located at or near the stress neutral plane due to the first groove GR1, therefore, generation of cracks in the second inorganic encapsulation layer 530 or detachment of the second inorganic encapsulation layer 530 from the organic encapsulation layer 520 may be prevented or substantially prevented. Further, a contact area between the second electrode 440 and the first inorganic encapsulation layer 510 may increase due to the first groove GR1; therefore, the attachment between the display structure 400 and the encapsulation structure 500 may increase. Further, a flexible display device in which the first bending area BA1 is bent with a relatively low curvature may be formed.

In an embodiment, the second groove GR2 may be exposed. Accordingly, a thickness of the organic layer including the planarization layer 300 and the pixel defining layer 420 inside the second bending area BA2 may be less than a thickness of the organic layer including the planarization layer 300 and the pixel defining layer 420 inside the non-bending area NBA adjacent to the second bending area BA2. When the second bending area BA2 of the flexible display device according to the present embodiment in which the second groove GR2 is formed is bent, a stress applied to the second bending area BA2 may decrease due to the decrease of a thickness of the organic layer including the planarization layer 300 and the pixel defining layer 420 inside the second bending area BA2. Further, a flexible display device in which the second bending area BA2 is bent with a relatively low curvature may be formed.

Figure 5:
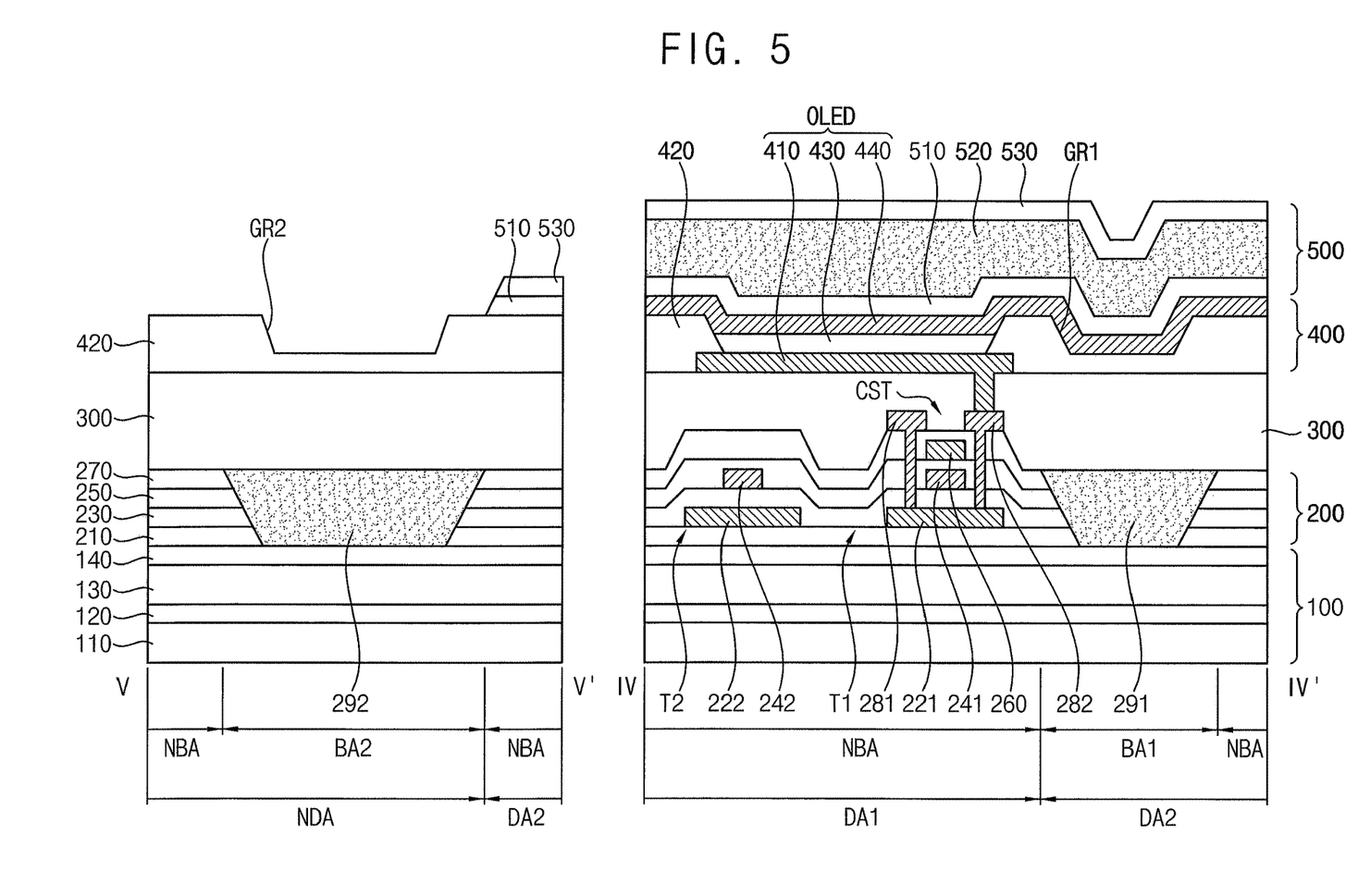
FIG. 5 is a cross-sectional view illustrating a flexible display device according to an embodiment.

FIG. 5 is a cross-sectional view illustrating a flexible display device according to an embodiment. FIG. 5 may illustrate an example of the flexible display device taken along the line IV-IV' and the line V-V' in FIG. 1.

Referring to FIGS. 1 and 5, a flexible display device according to an embodiment may include a base structure 100, a circuit structure 200, a planarization layer 300, a display structure 400, and an encapsulation structure 500. An organic layer 420 may be disposed over the circuit structure 200, and the organic layer 420 may have grooves GR1 and GR2 corresponding to the bending area BA. Descriptions of elements of the flexible display device described with reference to FIG. 5 which are substantially the same as or similar to those of the flexible display device described above with reference to FIG. 4 may not be repeated.

In an embodiment, the grooves GR1 and GR2 corresponding to the bending area BA may be formed in the pixel defining layer 420. The grooves GR1 and GR2 may pass through at least a portion of a thickness of the pixel defining layer 420 inside the bending area BA. A first groove GR1 may be formed in the first bending area BA1, and a second groove GR2 may be formed in the second bending area BA2. The first groove GR1 may overlap or may not overlap the first electrode 410.

In an embodiment, the grooves GR1 and GR2 passing through at least a portion of the pixel defining layer 420 may be formed by photolithography, laser drilling, or the like, in the bending area BA of the flexible display device in which the pixel defining layer 420 is formed, and the second electrode 440 and the encapsulation structure 500 may be formed in the display area DA on the pixel defining layer 420.

In an embodiment, a portion of the second electrode 440 and a portion of the encapsulation structure 500 which are disposed on the pixel defining layer 420 may be located inside the first groove GR1. As illustrated in FIG. 5, a portion of the second electrode 440 and a portion of the first inorganic encapsulation layer 510 may be located inside the first groove GR1.

Figure 6:
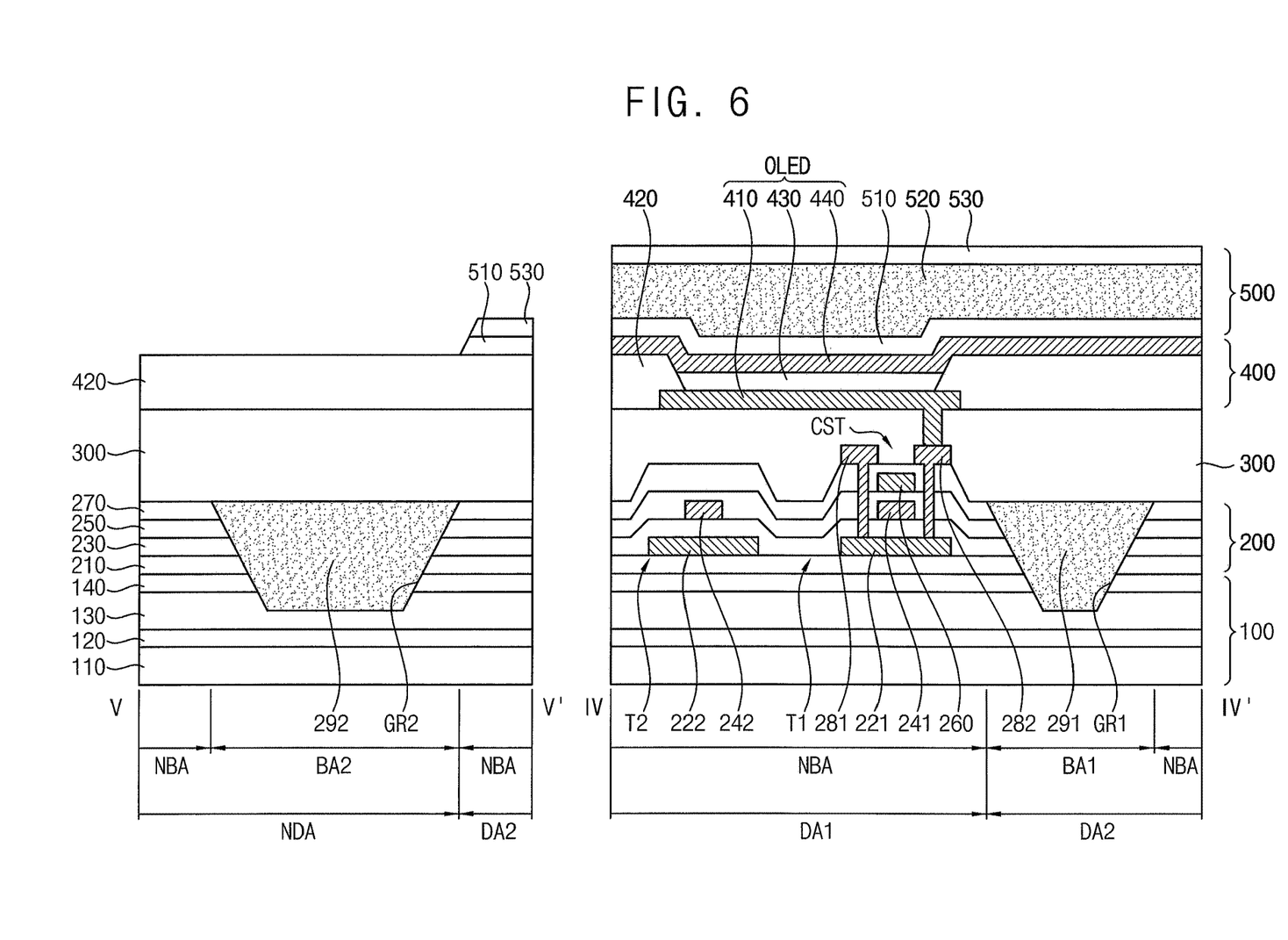
FIG. 6 is a cross-sectional view illustrating a flexible display device according to an embodiment.

FIG. 6 is a cross-sectional view illustrating a flexible display device according to an embodiment. FIG. 6 may illustrate an example of the flexible display device taken along the line IV-IV' and the line V-V' in FIG. 1.

Referring to FIGS. 1 and 6, a flexible display device according to an embodiment may include a base structure 100, a circuit structure 200, a planarization layer 300, a display structure 400, and an encapsulation structure 500. A second base layer 130 including an organic material may be disposed under the circuit structure 200, and the second base layer 130 may have grooves GR1 and GR2 corresponding to the bending area BA. Descriptions of elements of the flexible display device described with reference to FIG. 6 which are substantially the same as or similar to those of the flexible display device described above with reference to FIG. 4 may not be repeated.

In an embodiment, the grooves GR1 and GR2 corresponding to the bending area BA may be formed in the second base layer 130 and the second barrier layer 140 of the base structure 100. In an embodiment, the grooves GR1 and GR2 may pass through an entirety of a thickness of the inorganic insulation layers 210, 230, 250, and 270, an entirety of a thickness of the second barrier layer 140, and at least a portion of a thickness of the second base layer 130 inside the bending area BA. A first groove GR1 may be formed in the first bending area BA1, and a second groove GR2 may be formed in the second bending area BA2. The first groove GR1 may overlap or may not overlap the first electrode 410.

In an embodiment, the grooves GR1 and GR2 may be filled with an organic material. For example, as illustrated in FIG. 6, the organic insulation layers 291 and 292 may be respectively disposed inside the grooves GR1 and GR2 such that the grooves GR1 and GR2 may be filled with an organic material.

In an embodiment, the grooves GR1 and GR2 passing through the inorganic insulation layers 210, 230, 250, and 270, the second barrier layer 140, and at least a portion of the second base layer 130 may be formed by photolithography, laser drilling, or the like, in the bending area BA of the flexible display device in which the inorganic insulation layers 210, 230, 250, and 270 are formed, and the organic insulation layers 291 and 292 respectively filling the grooves GR1 and GR2 with an organic material may be formed.

In a flexible display device according to a comparative example of the prior art in which a groove is not formed in a base structure, the flexible display device may include a second barrier layer formed of an inorganic material inside a bending area such that a stress of the base structure due to bending may increase. However, in the flexible display device according to embodiments of the present embodiment, the grooves GR1 and GR2 may be formed in the second barrier layer 140 and the second base layer 130 inside the bending area BA of the base structure 100, and the grooves GR1 and GR2 may be filled with an organic material, such that a stress of the base structure 100 due to bending may be decreased. In an embodiment, the grooves GR1 and GR2 may not be formed in the first barrier layer 120 such that the first barrier layer 120 formed of inorganic material may be located on the first base layer 110 formed of an organic material. Therefore, permeation of impurities such as oxygen and moisture into the flexible display device through the first base layer 110 may be prevented or substantially prevented.

Figure 7:
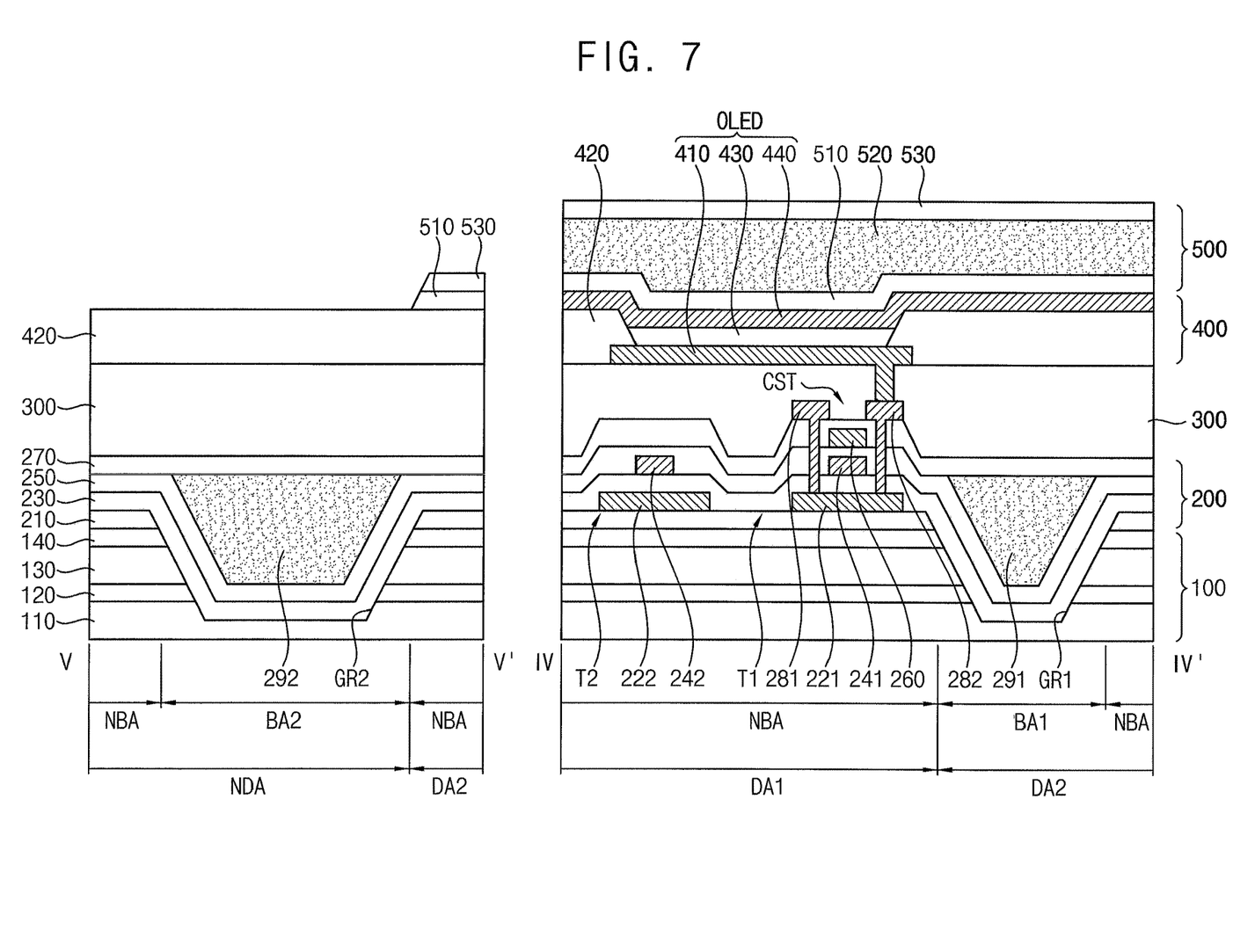
FIG. 7 is a cross-sectional view illustrating a flexible display device according to an embodiment.

FIG. 7 is a cross-sectional view illustrating a flexible display device according to an embodiment. FIG. 7 may illustrate an example of the flexible display device taken along the line IV-IV' and the line V-V' in FIG. 1.

Referring to FIGS. 1 and 7, a flexible display device according to an embodiment may include a base structure 100, a circuit structure 200, a planarization layer 300, a display structure 400, and an encapsulation structure 500. First and second base layers 110 and 130 including an organic layer may be disposed under the circuit structure 200, and the first and second base layers 110 and 130 may have grooves GR1 and GR2 corresponding to the bending area BA. Descriptions of elements of the flexible display device described with reference to FIG. 7 which are substantially the same as or similar to those of the flexible display device described with reference to FIG. 6 may not be repeated.

In an embodiment, the grooves GR1 and GR2 corresponding to the bending area BA may be formed in the first base layer 110, the first barrier layer 120, the second base layer 130, and the second barrier layer 140 of the base structure 100. In an embodiment, the grooves GR1 and GR2 may pass through an entirety of a thickness of the buffer layer 210, an entirety of a thickness of the second barrier layer 140, an entirety of a thickness of the second base layer 130, an entirety of a thickness of the first barrier layer 120, and at least a portion of a thickness of the first base layer 110 inside the bending area BA. A first groove GR1 may be formed in the first bending area BA1, and a second groove GR2 may be formed in the second bending area BA2. The first groove GR1 may overlap or may not overlap the first electrode 410.

In an embodiment, the first inorganic insulation layer 230 and the second inorganic insulation layer 250 may cover the grooves GR1 and GR2, and the grooves GR1 and GR2 may be filled with an organic material. For example, as illustrated in FIG. 7, the first inorganic insulation layer 230 and the second inorganic insulation layer 250 may sequentially cover the grooves GR1 and GR2, and the organic insulation layers 291 and 292 may be disposed on the second inorganic insulation layer 250 such that the grooves GR1 and GR2 respectively covered by the first inorganic insulation layer 230 and the second inorganic insulation layer 250 may be filled with an organic material. Further, the third inorganic insulation layer 270 may cover the organic insulation layers 291 and 292.

In an embodiment, the grooves GR1 and GR2 passing through the buffer layer 210, the second barrier layer 140, the second base layer 130, the first barrier layer 120, and at least a portion of the first base layer 110 may be formed by photolithography, laser drilling, or the like, in the bending area BA of the flexible display device in which the buffer layer 210 is formed, and the first inorganic insulation layer 230 and the second inorganic insulation layer 250 may be sequentially formed on the buffer layer 210. Then, the organic insulation layers 291 and 292 respectively filling the grooves GR1 and GR2 on the second inorganic insulation layer 250 with an organic material may be formed, and the third inorganic insulation layer 270 covering the organic insulation layers 291 and 292 may be formed on the second inorganic insulation layer 250.

In a flexible display device according to a comparative example of the prior art in which a groove is not formed in a base structure, the flexible display device may include a first barrier layer and a second barrier layer formed of an inorganic material inside a bending area such that a stress of the base structure due to bending may increase. However, in the flexible display device according to the present embodiment, the grooves GR1 and GR2 may be formed in the second barrier layer 140, the second base layer 130, the first barrier layer 120, and the first base layer 110 inside the bending area BA of the base structure 100, and the grooves GR1 and GR2 may be filled with an organic material, such that a stress of the base structure 100 due to bending may be decreased. Further, although the grooves GR1 and GR2 are formed in the first barrier layer 120 and the second barrier layer 140, the first inorganic insulation layer 230 and the second inorganic insulation layer 250 formed of an inorganic material may be located on the first base layer 110 formed of an organic material. Therefore, permeation of impurities such as oxygen and moisture into the flexible display device through the first base layer 110 may be prevented or substantially prevented.

Figure 8:
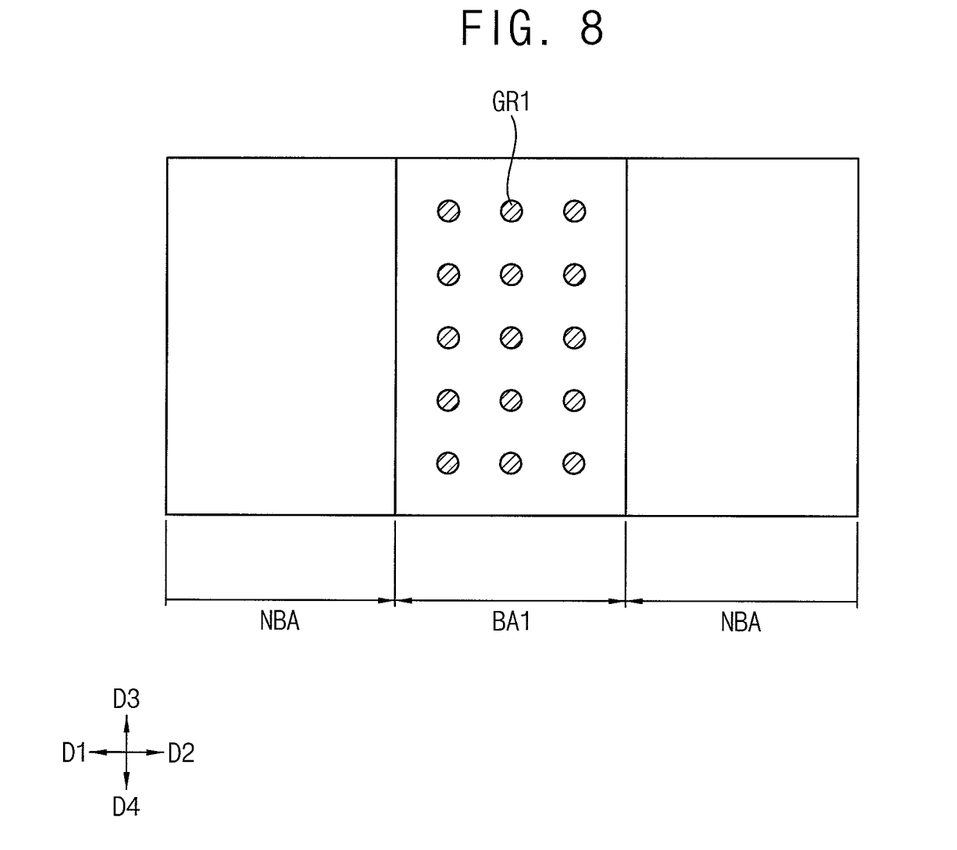
FIG. 8 is a plan view illustrating a region VIII in FIG. 1.
Figure 9:
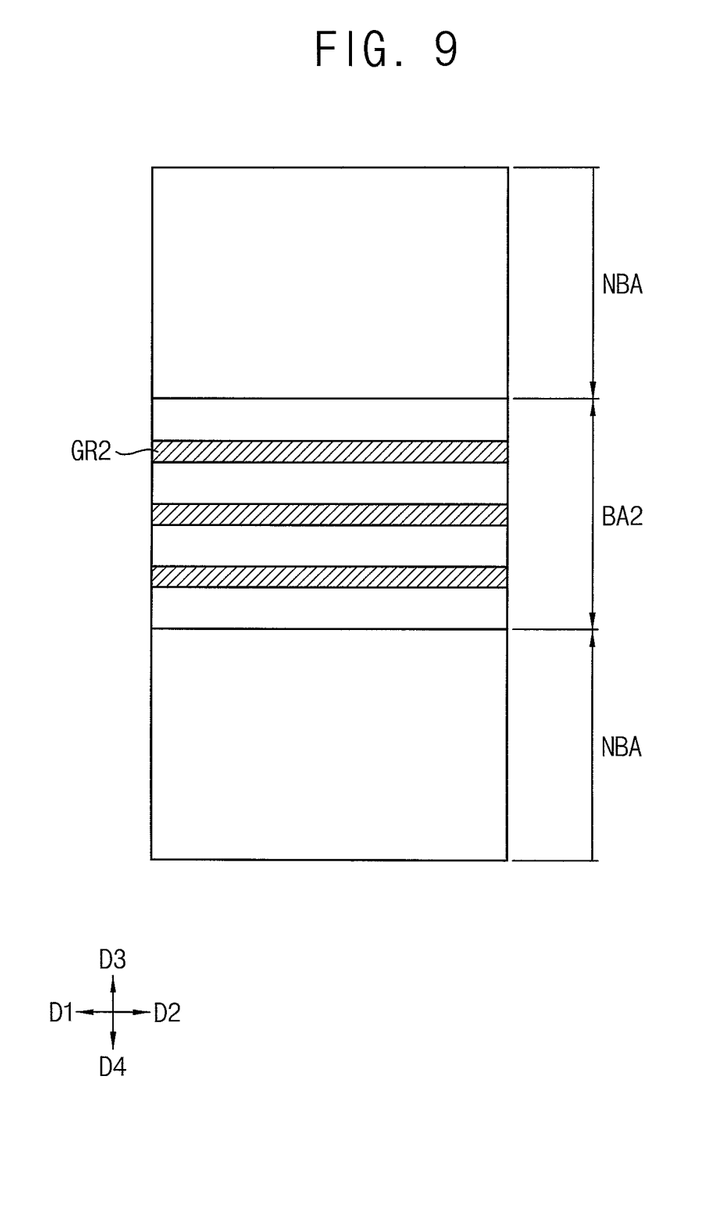
FIG. 9 is a plan view illustrating a region IX in FIG. 1.

FIG. 8 is a plan view illustrating a region VIII in FIG. 1; and FIG. 9 is a plan view illustrating a region IX in FIG. 1.

Referring to FIGS. 1, 8, and 9, in an embodiment, a plurality of grooves GR1 and GR2 may be formed inside the bending area BA. For example, a plurality of first grooves GR1 may be formed in the first bending area BA1, and a plurality of second grooves GR2 may be formed in the second bending area BA2.

The grooves GR1 and GR2 may have any of various planar shapes, such as a line shape, a dot shape, etc. In an embodiment, the first groove GR1 located in the first bending area BA1 may have a dot shape, and the second groove GR2 located in the second bending area BA2 may have a line shape. For example, the first grooves GR1 having the dot shapes may be arranged along the first direction D1 and the third direction D3, and the second grooves GR2 having the line shapes may be extended in the first direction D1 and arranged along the third direction D3. However, embodiments are not limited thereto, and, in another embodiment, the first groove GR1 may have another shape, such as a line shape, etc., and the second groove GR2 may have another shape, such as a dot shape, etc.

The grooves GR1 and GR2 may be substantially uniformly arranged or unevenly arranged inside the bending area BA. The grooves GR1 and GR2 are shown substantially uniformly arranged inside the bending area BA in FIGS. 8 and 9; however, the grooves GR1 and GR2 may be unevenly arranged inside the bending area BA. In an embodiment, for example, the grooves GR1 and GR2 may be relatively densely disposed in a stressed portion in the bending area BA, and the grooves GR1 and GR2 may be relatively sparsely disposed in a less-stressed portion in the bending area BA. In other words, the number of the grooves GR1 and GR2 per a unit area may be relatively large in the stressed portion in the bending area BA, and the number of the grooves GR1 and GR2 per the unit area may be relatively small in the less-stressed portion in the bending area BA.

In embodiments, the flexible display device according to embodiments may be applied to a display device included in a computer, a notebook, a mobile phone, a smartphone, a smart pad, a PMP, a PDA, an MP3 player, or the like.

Although the flexible display device according to some embodiments has been described with reference to the drawings, the illustrated embodiments are examples, and may be modified or changed by a person having ordinary skill or knowledge in the relevant technical field without departing from the technical spirit and scope set forth in the following claims.

What is claimed is:

1. A display device including a flat area and a flexible area, the display device comprising:
    a circuit structure;
    a display structure on the circuit structure; and
    an organic layer under or over the circuit structure, the organic layer comprising at least one groove overlapping the flexible area.

2. The display device of claim 1, further comprising a planarization layer between the circuit structure and the display structure,
    wherein the display structure comprises:
    a first electrode on the planarization layer;
    a pixel defining layer at a periphery of the first electrode on the planarization layer;
    an emission layer on the first electrode; and
    a second electrode on the emission layer, and
    wherein the organic layer comprises the planarization layer or the pixel defining layer.

3. The display device of claim 2, further comprising an encapsulation structure on the display structure,
    wherein a portion of the encapsulation structure is inside a groove of the at least one groove.

4. The display device of claim 3, wherein the encapsulation structure comprises:
    a first inorganic encapsulation layer on the display structure;
    an organic encapsulation layer on the first inorganic encapsulation layer; and
    a second inorganic encapsulation layer on the organic encapsulation layer, and
    wherein a height of a first portion of the second inorganic encapsulation layer inside the groove is lower than a height of a second portion of the second inorganic encapsulation layer outside the groove.

5. The display device of claim 2, wherein a groove of the at least one groove is exposed.

6. The display device of claim 1, further comprising a base structure under the circuit structure,
    wherein the base structure comprises:
    a first base layer;
    a first barrier layer on the first base layer;
    a second base layer on the first barrier layer; and
    a second barrier layer between the second base layer and the circuit structure, and
    wherein the organic layer comprises the second base layer.

7. The display device of claim 6, further comprising an organic material in a groove of the at least one groove.

8. The display device of claim 1, wherein the flat area comprises a first display area and a second display area located at a side of the first display area, and
    wherein the flexible area is adjacent to a boundary between the first display area and the second display area.

9. The display device of claim 1, wherein the flat area comprises a display area and a non-display area located at a side of the display area, and
    wherein the flexible area is adjacent to a boundary between the display area and the non-display area.

10. A display device including a flat area and a flexible area, the display device comprising:
    a base structure;
    a circuit structure on the base structure;
    a planarization layer on the circuit structure;
    a first electrode on the planarization layer;
    a pixel defining layer at a periphery of the first electrode on the planarization layer;
    an emission layer on the first electrode; and
    a second electrode on the emission layer,
    wherein at least the pixel defining layer comprises at least one groove overlapping the flexible area.

11. The display device of claim 10, wherein the at least one groove is defined in the planarization layer and the pixel defining layer.

12. The display device of claim 10, further comprising an encapsulation structure on the second electrode,
    wherein a portion of the encapsulation structure is inside a groove of the at least one groove.

13. The display device of claim 12, wherein the encapsulation structure includes:
    a first inorganic encapsulation layer on the second electrode;
    an organic encapsulation layer on the first inorganic encapsulation layer; and
    a second inorganic encapsulation layer on the organic encapsulation layer, and
    wherein a height of a first portion of the second inorganic encapsulation layer inside the groove is lower than a height of a second portion of the second inorganic encapsulation layer outside the groove.

14. The display device of claim 10, wherein a groove of the at least one groove is exposed.

15. A display device including a flat area and a flexible area, the display device comprising:
    a base structure comprising at least one base layer;
    a circuit structure on the base structure;
    a planarization layer on the circuit structure; and a display structure on the planarization layer;
wherein the at least one base layer of the base structure comprises at least one groove overlapping the flexible area.

16. The display device of claim 15, wherein the base structure comprises:
a first base layer of the at least one base layer;
a first barrier layer on the first base layer;
a second base layer of the at least one base layer, the second base layer being on the first barrier layer; and
a second barrier layer between the second base layer and the circuit structure, and
wherein the at least one groove is defined in the second base layer and the second barrier layer.

17. The display device of claim 16, wherein a groove of the at least one groove is filled with an organic material.

18. The display device of claim 15, wherein the base structure comprises:
a first base layer of the at least one base layer;
a first barrier layer on the first base layer;
a second base layer of the at least one base layer, the second base layer being on the first barrier layer; and
a second barrier layer between the second base layer and the circuit structure, and
wherein the at least one groove is defined in the first base layer, the first barrier layer, the second base layer, and the second barrier layer.

19. The display device of claim 18, wherein the circuit structure comprises:
a first inorganic insulation layer on the base structure; and
a second inorganic insulation layer on the first inorganic insulation layer,
wherein the first inorganic insulation layer and the second inorganic insulation layer cover the at least one groove, and
wherein an organic material fills a groove of the at least one groove on the second inorganic insulation layer.

* * * * *